United States Patent [19]
Distefano et al.

[11] Patent Number: 6,080,603
[45] Date of Patent: Jun. 27, 2000

[54] FIXTURES AND METHODS FOR LEAD BONDING AND DEFORMATION

[75] Inventors: Thomas Distefano, Monte Sereno; John W. Smith, Palo Alto, both of Calif.; Anthony B. Faraci, Georgetown, Tex.

[73] Assignee: Tessera, Inc., San Jose, Calif.

[21] Appl. No.: 09/268,286

[22] Filed: Mar. 15, 1999

Related U.S. Application Data

[63] Continuation of application No. 08/690,532, Jul. 31, 1996, Pat. No. 5,913,109, which is a continuation of application No. 08/440,665, May 15, 1995, Pat. No. 5,801,441, which is a division of application No. 08/271,768, Jul. 7, 1994, Pat. No. 5,518,964.
[60] Provisional application No. 60/001,718, Jul. 31, 1996.
[51] Int. Cl.[7] .................................................. H01L 21/44
[52] U.S. Cl. .............................. 438/117; 438/113
[58] Field of Search .................... 438/117, 113, 438/114, 464

[56] References Cited

U.S. PATENT DOCUMENTS

| | | |
|---|---|---|
| 3,373,481 | 3/1968 | Lins et al. . |
| 3,795,037 | 3/1974 | Luttmer . |
| 3,811,186 | 5/1974 | Larnerd et al. . |
| 3,825,353 | 7/1974 | Loro . |
| 3,842,189 | 10/1974 | Southgate . |
| 3,952,404 | 4/1976 | Matunami . |
| 4,067,104 | 1/1978 | Tracy . |
| 4,142,288 | 3/1979 | Flammer et al. . |
| 4,326,663 | 4/1982 | Oettel . |
| 4,447,857 | 5/1984 | Marks et al. . |
| 4,520,562 | 6/1985 | Sade et al. . |
| 4,629,957 | 12/1986 | Walteis et al. . |
| 4,661,192 | 4/1987 | McShaen . |
| 4,667,219 | 5/1987 | Lee et al. . |
| 4,721,995 | 1/1988 | Tanizawa . |
| 4,751,199 | 6/1988 | Phy . |
| 4,785,137 | 11/1988 | Samuels . |
| 4,793,814 | 12/1988 | Zifcak et al. . |
| 4,812,191 | 3/1989 | Ho et al. . |
| 4,893,172 | 1/1990 | Matsummoto et al. . |
| 4,926,241 | 5/1990 | Carey . |
| 4,949,158 | 8/1990 | Ueda . |
| 4,954,877 | 9/1990 | Fox et al. . |
| 4,955,523 | 9/1990 | Calomagno et al. . |
| 5,047,830 | 9/1991 | Grabbe . |
| 5,049,085 | 9/1991 | Reylek et al. . |

(List continued on next page.)

FOREIGN PATENT DOCUMENTS

| | | |
|---|---|---|
| 0072673A2 | 8/1982 | European Pat. Off. . |
| 6191939 | 5/1986 | Japan . |
| 1-55633 | 6/1989 | Japan . |
| 3-108734 | 5/1991 | Japan . |
| 2151529 | 12/1983 | United Kingdom . |
| 2142568 | 1/1985 | United Kingdom . |
| WO 96/02068 | 1/1996 | WIPO . |

OTHER PUBLICATIONS

"Method of Testing Chips and Joining Chips to Substrates", Research Disclosure, Feb. 1991, No. 322, Kenneth Mason Publication Ltd., England.

IBM Technical Disclosure Bulletin, vol. 36, No. 07, Jul. 1993.

*Primary Examiner*—Kevin M. Picardat
*Attorney, Agent, or Firm*—Lerner, David, Littenberg, Krumholz & Mentlik, LLP

[57] ABSTRACT

In a method for mounting a sheet-like microelectronic element, the sheet-like element comprises a dielectric layer having a top surface and a bottom surface and is first bonded to an expansion ring. The expansion ring is then heated to stretch the sheet-like element. A frame ring, having an external diameter smaller than the internal diameter of the expansion ring, is then bonded to the sheet-like element. A plurality of leads are formed on the bottom surface of the sheet-like element, the leads including bonding pads. In other embodiments, a method is provided for bonding bond pads on a sheet-like microelectronic element to contacts on a microelectronic component.

29 Claims, 5 Drawing Sheets

U.S. PATENT DOCUMENTS

| | | |
|---|---|---|
| 5,055,907 | 10/1991 | Jacobs . |
| 5,057,460 | 10/1991 | Rose . |
| 5,067,007 | 11/1991 | Kanji et al. . |
| 5,086,337 | 2/1992 | Noro et al. . |
| 5,131,852 | 7/1992 | Grabbe et al. . |
| 5,152,695 | 10/1992 | Grabbe et al. . |
| 5,166,099 | 11/1992 | Ueda et al. . |
| 5,173,055 | 12/1992 | Grabbe . |
| 5,192,716 | 3/1993 | Jacobs . |
| 5,197,892 | 3/1993 | Yoshizawa et al. . |
| 5,210,939 | 5/1993 | Mallik et al. . |
| 5,230,931 | 7/1993 | Yamazaki et al. . |
| 5,254,811 | 10/1993 | Ludden et al. . |
| 5,286,680 | 2/1994 | Cain . |
| 5,346,861 | 9/1994 | Khandros et al. . |
| 5,528,083 | 6/1996 | Malladi et al. . |
| 5,913,109 | 6/1999 | Distefano et al. ............... 438/117 |

FIXTURES AND METHODS FOR LEAD BONDING AND DEFORMATION

The present application claims benefit of U.S. Provisional Application Ser. No. 60/001,718 filed Jul. 31, 1996. This application is a continuation of application Ser. No. 08/690,532, filed Jul. 31, 1996, now U.S. Pat. No. 5,913,109, which in turn is a is a file wrapper continuation application of application Ser. No. 08/440,665 filed May 15, 1995, now U.S. Pat. No. 5,801,441, which application was a divisional application of application Ser. No. 08/271,768, filed Jul. 7, 1994, which issued on May 21, 1996 as U.S. Pat. No. 5,518,964.

FIELD OF THE INVENTION

The present invention relates the fabrication of mounting and connection devices for use with microelectronic elements such as semiconductor chips.

BACKGROUND OF THE INVENTION

Complex microelectronic devices such as modern semiconductor chips require numerous connections to other electric components. For example, a complex microprocessor chip may require many hundreds of connections to external devices.

Semiconductor chips have commonly been connected to electrical traces on mounting substrates using several alternative methods, including wire bonding, tape automated bonding and flip-chip bonding. Each of these techniques presents various problems including difficulty in testing the chip after bonding, long lead lengths, large areas occupied by the chip on the microelectronic assembly, and fatigue of the connections due to changes in size of the chip and the substrate under thermal expansion and contraction.

Numerous attempts have been made to solve the foregoing problems. One structure that has been used to successfully address these problems is the "interposer" or "chip carrier", disclosed in commonly assigned U.S. Pat. Nos. 5,148,265, 5,148,266 and 5,455,390. Interposers according to certain embodiments taught in these patents comprise a flexible, sheet-like element having a plurality of terminals disposed thereon. Flexible leads are used to connect the terminals with contacts on a microelectronic component such an integrated circuit. The terminals may then be used to test the microelectronic chip, and may be subsequently bonded to a final microelectronic assembly. The flexible leads permit thermal expansion of the various components without inducing stresses in the connection.

A compliant layer may be disposed between the microelectronic component and the flexible, sheet-like structure. The compliant layer encapsulates the leads and facilitates connection of the terminals to a test device and/or to the final electronic assembly by compensating for variations in component flatness and terminal heights.

Commonly assigned U.S. Pat. No. 5,518,964, hereby incorporated in its entirety herein, discloses further improvements in microelectronic connections. In certain embodiments of the '964 patent, a flexible, sheet-like element has a first surface with a plurality of elongated, flexible leads extending from a terminal end attached to the sheet-like element to a tip end offset from the terminal end in a preselected, first horizontal direction parallel to the sheet-like element. The tip ends have bond pads for connection to a microelectronic component. Each of the plurality of leads is simultaneously formed by moving all of the tip ends of the leads relative to the terminal ends thereof so as to bend the tip ends away from the sheet-like element. This is accomplished by relative movement between the sheet-like element and the microelectronic component.

The tip ends of the leads are initially attached to the sheet-like element. The initial position of the bond pads on the tip ends is thereby fixed in order to facilitate attachment to the microelectronic component.

During or after forming the leads by displacing the microelectronic element relative to the sheet-like element, a compliant material, such as silicone, is injected between the microelectronic element and the sheet-like element. The compliant layer facilitates testing by providing an even pressure on all the terminals located on the flexible sheet-like element regardless of the flatness of the testing fixture. Similar advantages are realized during final assembly.

In one method taught in the '964 patent for fabricating an assembly comprising an interposer and a microelectronic chip, a flexible, multilayer dielectric sheet-like element is stretched taut using mechanical means. While the multilayer sheet is maintained in the taut condition, it is bonded to a ring-like generally circular frame so that the multi-layer sheet stretches across the central opening of the frame. The multi-layer sheet is bonded to the frame using a suitable hot temperature adhesive such as epoxy resin film, preferably on the order of about 10 microns thick. The frame is formed from molybdenum because that material has coefficient of thermal expansion substantially equal to that of the silicon semiconductor part with which the assemblage will be used in later steps. The flexible dielectric sheet-like element is maintained in its stretched, taut condition by the molybdenum ring until the end of the process. The sheet is therefore maintained in a stable, repeatable condition for formation of the leads and for bonding to the microelectronic component. The multi-layer dielectric sheet-like element is then processed in order to form the leads, terminals and bonding pads necessary to make connections between the microelectronic element and other components.

After terminals, leads, and other elements have been formed on the sheet-like element, the sheet-like element, together with the molybdenum ring, is placed in a fixture on top of and adjacent to a wafer containing an array of microelectronic chips. The fixture, part of a hot-air press or an autoclave, has ports for the pressurization and evacuation of volumes defined by the top and bottom surfaces of the wafer and the sheet-like element. The wafer and the sheet-like element are next aligned by bringing the sheet-like element into registration with the wafer. One or both of those components are moved in the horizontal x-y directions through the use of micrometer screw adjusting devices. A microscope or machine vision system may be used in conjunction with fiducial markings on the components in order to assist in alignment.

Because the sheet-like element is continuously held taut throughout the lead-forming process and the aligning process by the same molybdenum frame, the leads remain in a constant, stable position with respect to the sheet-like element and with respect to each other. Alignment with the wafer is therefore precise over its entire area.

While the wafer and the sheet-like element are maintained in precise alignment, compressed inert gas such as nitrogen is admitted in order to increase the pressure between a top plate of the fixture and the sheet-like element. This biases the sheet-like element downwardly towards the wafer so that a bonding material on the bond pads located at the tips of each lead is engaged with a contact on the microelectronic component. Because pressure from the compressed gas exerts force equally across the area of the sheet-like element, contact engagement across the area is assured regardless of the heights of the contacts.

While the gas pressure is maintained, the assembly is heated to a temperature sufficient to activate the bonding material at the bond pads in order to form metallurgical bonds between the tip ends of the leads and the contacts of the microelectronic components on the wafer. During this operation, the sheet-like component tends to expand at a rate greater than the rate of expansion of the silicon wafer. However, because the sheet-like element is held under tension by the molybdenum frame, the thermal expansion of the sheet-like element is substantially taken up in relieving the tensile stress. The actual movement of features on the sheet-like element due to thermal expansion is approximately equal to the thermal expansion of the frame. The frame, in turn, has a coefficient of thermal expansion substantially equal to that of the wafer. Therefore, features of the sheet-like element remain in alignment with features of the wafer during the heating process.

After the bond pads are bonded to the microelectronic component, an encapsulant is injected between the dielectric sheet and the wafer such a silicone. The encapsulant is a flowable, curable dielectric material such as silicone. The encapsulant may be injected between the dielectric sheet and the wafer immediately after bonding, whereby the force of the pressurized encapsulant acting on those components separates them and bends the leads, forming a compliant lead configuration.

Alternatively, the leads may be formed before injecting the encapsulant by retaining the wafer and the sheet-like element against moveable platens by vacuum, and moving the platens with respect to each other, bending and forming the leads. The encapsulant is then injected while the dielectric sheet and the wafer are in their displaced positions.

The injection operation is performed either using the same fixture in which the bonding step is performed or in a second fixture. The flowable material is constrained between the flexible sheet and the wafer, and does not cover the terminal features on the top surface of the dielectric sheet which remain exposed for testing and for permanent bonding to a microelectronic assembly.

After the flowable, curable dielectric material has been cured, the flexible sheet/microelectronic component assembly is removed from the fixture, trimmed and tested. The fixture is then reused to perform the above operations on the next flexible sheet/dielectric component assembly.

Still further improvement in the above-described process would be desirable.

SUMMARY OF THE INVENTION

One aspect of the present invention provides a method for mounting a sheet-like, microelectronic element in which the sheet-like element is initially bonded to an expansion ring. The expansion ring is then heated, inducing thermal expansion that stresses the sheet-like element uniformly taut. The sheet-like element is then bonded to a frame ring having an outside diameter less than the inside diameter of the expansion ring. The expansion ring consists of a material having a relatively high coefficient of thermal expansion, and may have a coefficient of thermal expansion greater than that of molybdenum. Most preferably, the material is aluminum. The frame ring advantageously has a coefficient of thermal expansion approximating that of silicon, and may consist essentially of molybdenum. Preferred methods according to this aspect of the invention provide reliable, repeatable and uniform stretching of the sheet at very low cost.

In another aspect of the invention, a method is provided for bonding a plurality of bond pads disposed on a flexible, sheet-like microelectronic element to a plurality of contacts on a microelectronic component. The method includes the steps of mounting the flexible, sheet-like element to a frame ring, placing the microelectronic component on a rigid plate, and then placing the frame ring on the rigid plate so that the sheet-like element overlies the microelectronic component. The bond pads on the flexible sheet-like element are then aligned with the contacts on the microelectronic component by moving the element and the component in relation to one another. A disk is then placed on the top of the sheet-like element, and downward pressure is applied to the disk, whereby the bond pads are pressed against the contacts. The entire assembly is then heated, activating a bonding agent at an interface between the bond pads and the contacts. In this method, the rigid plate and/or the frame ring may consist essentially of molybdenum and the disk may consist essentially of ceramic. The assembly may be heated by placing the rigid plate on a hot plate.

The bond pads on the sheet-like element may be at the ends of deformable leads formed on the sheet-like element. The method may further comprise the step of bending the deformable leads. The leads may be bent by pressure forces of an encapsulant injected between the sheet-like element and the microelectronic component, or may be bent by mechanically displacing those two components in two directions.

Preferred methods according to this aspect of the invention perform the pad bonding step without use of the fixture used for moving the sheet and injecting. Thus the fixture can be used with one set of parts while the bonding step is being performed on the next set of parts. The compliant material cannot interfere with the alignment and bonding operation.

In yet another aspect of the invention, a method is provided for bonding a plurality of bond pads disposed on a flexible, sheet-like element to a plurality of contacts on a microelectronic component. The method comprises the steps of bonding the sheet-like element to an expansion ring, heating and expanding the expansion ring to stretch the sheet-like element taut, and bonding the sheet-like element to a frame ring, the frame ring having an outside diameter less than an inside diameter of the expansion ring. The microelectronic component is then placed on a rigid plate, and the frame ring with the sheet-like element is placed over the microelectronic component. The bond pads on the sheet-like element are then aligned with the contacts on the microelectronic component by moving the rigid ring and the component in relation to one another. A disk is then placed on the sheet-like element and downward pressure is applied on the disk to press the bond pads against the contacts. The assembly is then heated to activate a bonding agent at the interface between the bond pads and the contacts.

These and other objects, features and advantages to the present invention, will be more readily apparent from the detailed description of the preferred embodiments set forth below, taken in conjunction with the accompanying drawings.

DETAILED DESCRIPTION OF THE PREFERRED EMBODIMENT

Figure 1:
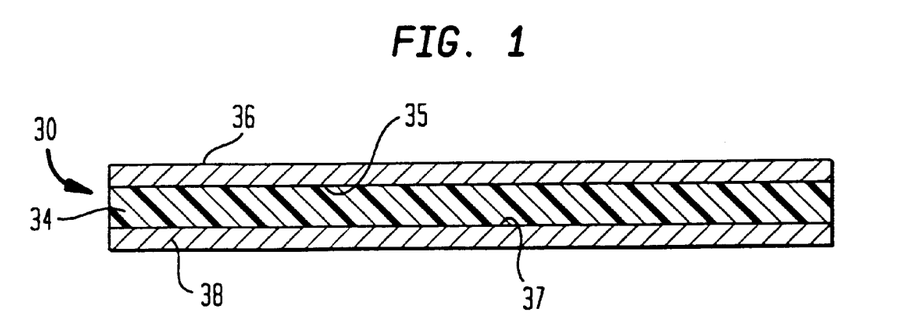
FIG. 1 is a sectional view of the multi-layer, flexible, sheet-like element used in the manufacture of a component according to one embodiment of the invention.

A process for manufacturing components according to one embodiment of the invention begins with a starting multi-layer sheet-like element 30. The multi-layer sheet 30 includes a dielectric sheet 34 (FIG. 1) preferably formed from a polymer such as polyimide. Dielectric sheet 34 is preferably between about 25 and about 100 microns thick and more preferably between about 25 and 50 microns thick. The top layer 36 of electrolytically deposited copper covers the top surface 35 of the dielectric sheet 34, whereas a similar bottom layer 38 covers the opposite, bottom surface 37 of the dielectric sheet. The copper layers may be from about 5 to about 25 microns thick. In the starting condition illustrated in FIG. 1, these layers are continuous and substantially uniform over the entire extent of multi-layer sheet 30.

Figure 2:
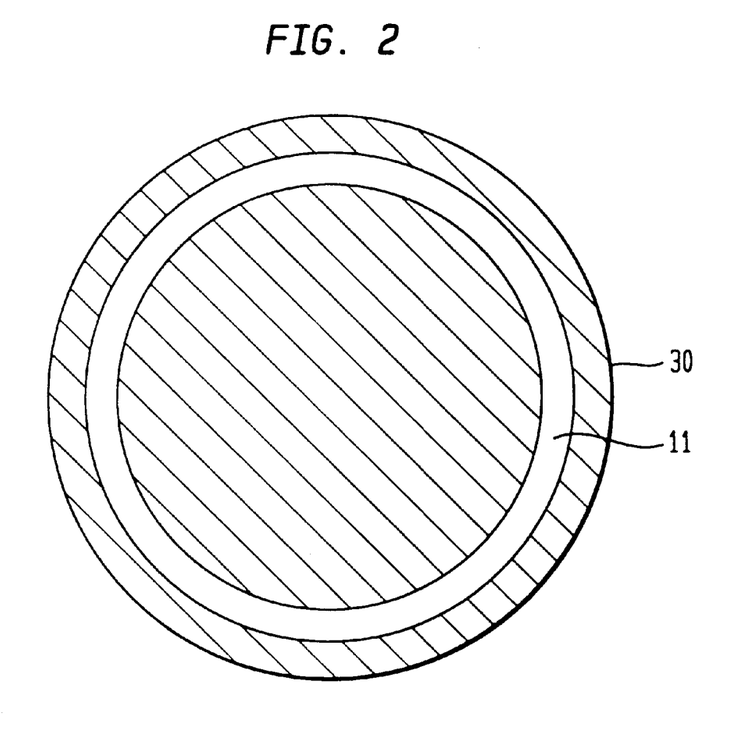
FIG. 2 is a plan view of elements used in the manufacture of a component according to one embodiment of the invention.

In order to further process the multi-layer, sheet-like element 30, the element must be stretched taut and bonded to a frame ring have a coefficient of thermal expansion approximately equal to that of silicon, the material comprising the semiconductor wafer to which the sheet will be bonded in a later step of the process. To stretch the sheet-like multi-layer element taut, the multilayer element 30 is first bonded to an expansion ring 11 (FIG. 2). The sheet is maintained flat and is assembled to the expansion ring 11 with a suitable high-temperature adhesive therebetween. The adhesive is preferably an epoxy resin film. The ring 11 is preferably formed using a material having a relatively high thermal coefficient of expansion, and is most preferably aluminum. During the assembly step, the expansion ring 11 and the sheet-like element 30 are at a first temperature below that used in the later steps of the process, preferably below about 10 deg. C and most preferably at about room temperature.

After assembly, the expansion ring 11 and the multi-layer sheet-like element 30 are placed in a high temperature oven and heated to a second temperature higher than the first. While the ring and the epoxy resin are maintained at the second temperature, the epoxy resin is fully cured, bonding the sheet-like element to the expansion ring. The expansion ring is maintained at the second temperature for a period of time in order to assure that the epoxy is fully cured before proceeding to the next step as described below.

In one example of the invention, an aluminum ring one inch thick having a ten inch outer diameter and an eight inch inner diameter is coated on one surface with epoxy resin, placed on a polyimide sheet, and placed in an oven at 150 deg. C for one hour. The heat cures the adhesive, bonding the polyimide sheet to the aluminum ring. In addition, the aluminum ring is partially expanded during this operation.

Figure 3:
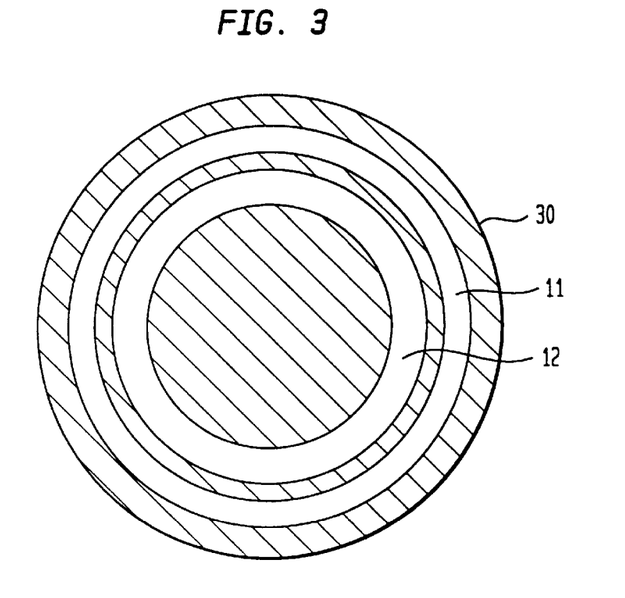
FIG. 3 is a plan view similar to FIG. 1 but at a progressively later stage of the process.

The expansion ring, together with the sheet-like element 30, is next removed from the oven and placed on a flat surface with the sheet-like element facing the surface. A second, or frame ring 12, having an outside diameter smaller than the inside diameter of the expansion ring 11, is coated with epoxy resin on a bottom surface and placed on the sheet-like element 30 inside the expansion ring (FIG. 3). The assembly is then returned to the oven which is heated to a third temperature higher than the second temperature, most preferably about 170–180 deg. C. The increase in temperature increases the diameter of the expansion ring and stretches the sheet-like element taut. When the assembly reaches thermal equilibrium at the third temperature, the sheet-like element is stretched taut evenly in all directions by the evenly heated ring. The expansion ring, which had previously been preheated to the second temperature, reaches equilibrium at the third temperature long before the frame ring and the accompanying epoxy is heated. Therefore, the sheet-like element 30 is stretched taut and in equilibrium before the epoxy on the frame ring 12 cures. The two stage heating process assures that the sheet-like element 30 is stretched taut after curing the epoxy bond with the expansion ring 11 but before curing the epoxy bond with the frame ring 12.

The assembly is then removed from the oven and cooled. The expansion ring is removed by severing the sheet-like element 30 between the expansion ring 11 and the frame ring 12.

The frame ring 12 must have a coefficient of thermal expansion lower than that of the expansion ring 11 in order to maintain tautness in the sheet-like element 30 when the assembly is returned to room temperature. Aluminum is used to construct the expansion ring 11 because of its relatively high thermal expansion properties. Because the sheet-like element 30 will be bonded to a silicon wafer in later steps of the process, it is important that the sheet-like element, as bonded to the frame ring 12, behave thermally like silicon in order to maintain alignment of terminals on the chip and bond pads on the sheet-like element across the entire surfaces of these elements. Molybdenum is used in constructing the frame ring 12 because molybdenum has a thermal expansion properties similar to those of silicon.

Figure 4:
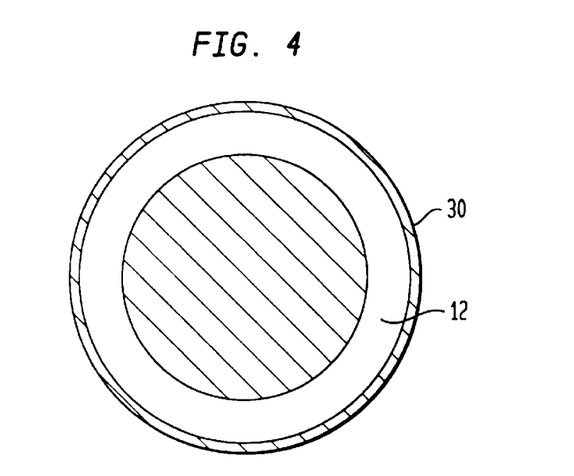
FIG. 4 is a plan view of the elements of FIG. 2 after the removal of an element according to one step in the process.

The multi-layer sheet-like element 30, together with the frame ring 12, as shown in FIG. 4, are now ready for processing in order to form the leads and other microelectronic components on the surfaces of the sheet-like element 30. The leads and other microelectronic elements are formed by applying electrophoretic resist, electroplating, etching, and other techniques for forming microelectronic circuitry known in the art. A detailed description of such a manufacturing process is contained in U.S. Pat. No. 5,518,964, assigned to the same assignee as the present application and hereby incorporated herein in its entirety.

Figure 5:
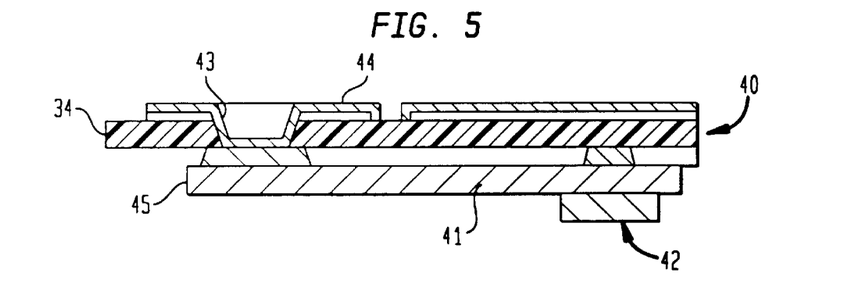
FIG. 5 is a schematic view of a lead used in a process according to one embodiment of the invention.

A lead 41 formed as part of the sheet-like element 30 according to such a process is attached to the polyimide sheet 34 at a terminal end 45 (FIG. 5). The terminal end 45 is attached through a blind via 43 to a terminal 44 on the opposite side of the polyimide layer 34. The opposite end of the lead 41 has a bond pad 42 for bonding to a microelectronic component. The leads are arranged in a substantially regular pattern on the sheet-like element 30, commonly in rectangular grids having constant pitches in the x and y directions. The grid pattern of leads of the sheet-like element 30 matches a grid pattern of terminals on the microelectronic component to which the sheet will be bonded.

After formation of the microelectronic leads 41, terminals 44 and bond pads 42, the bond pads 42 are bonded to corresponding terminal pads 50 (FIG. 8) on microelectronic element 51. This involves aligning the bond pads 42 with the terminal pads 50, bringing them into contact, and heating them to activate a bonding agent present at the interface between the bond pads and the terminal pads.

In the case where the microelectronic component comprises a large array of chips, tens or even hundreds of thousands of terminal pads must be brought into contact with corresponding bond pads on the sheet-like element. It is critical in bonding such a microelectronic component that force be applied evenly across the array regardless of the height of the individual terminal pads and bond pads. For this reason, a hot air press, also known as an autoclave, is used to pressurize the volume above the sheet-like element, applying an equal force to each of the thousands of bond pads. Such a process, however, may not be necessary in the case of a microelectronic element comprising only a single chip or a smaller array of chips, such as a 3×3 array of chips.

Figure 6:
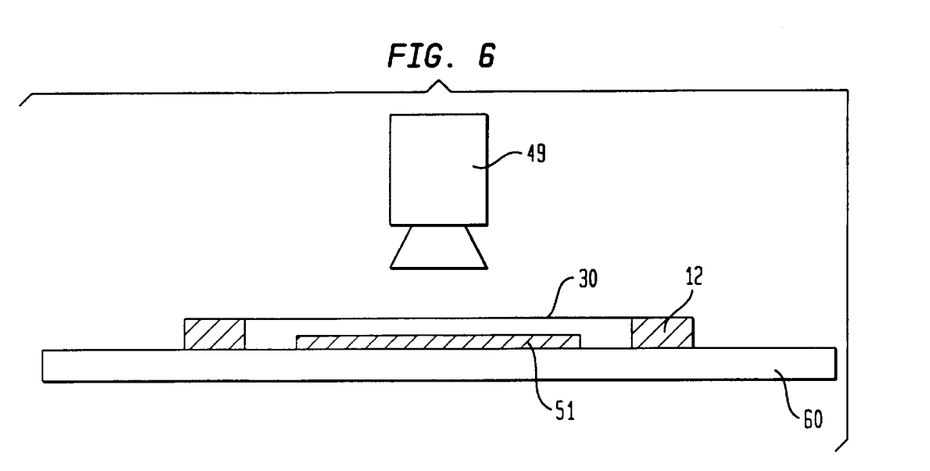
FIG. 6 is a sectional view of elements used in the manufacture of a component according to one embodiment of the invention.

In a process especially suitable for bonding to microelectronic components comprising a single chip or a smaller array of chips, the microelectronic element 51 is placed on a rigid base sheet 60 (FIG. 6). The base sheet 60 preferably has a coefficient of thermal expansion matching that of the silicon wafer in order to reduce or eliminate relative movement between the wafer and the base sheet, which in turn could affect the alignment described below. The sheet 60 may be comprised of molybdenum. If a material other than silicon is used in constructing the microelectronic component 51, then the base sheet 60 should be fabricated of a material having a coefficient of thermal expansion matching that of the microelectronic component.

The sheet-like element 30, which remains bonded to the frame ring 12, is placed over the microelectronic component. The face of the frame ring 12 to which the sheet-like element 30 is bonded faces away from the base sheet 60. The rigid ring 12, together with the sheet-like element 30, are then manipulated on the base sheet 60 in order to align the microelectronic features on the sheet-like element 30 with corresponding microelectronic features on the microelectronic component 51. A microscope may be used in this alignment procedure. Alternatively, a machine vision system 49, which may incorporate a microscope, may be used.

Figure 7:
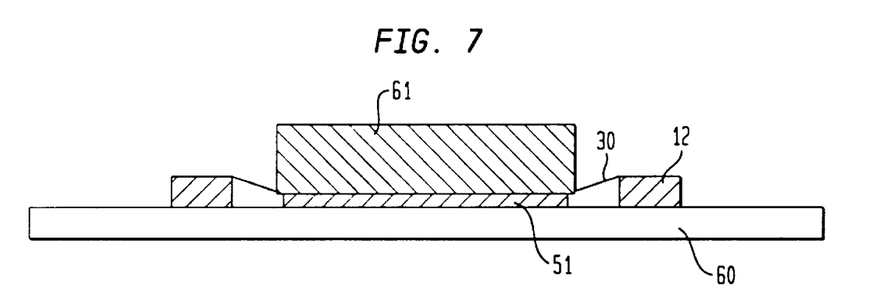
FIG. 7 is a sectional view similar to FIG. 5, depicting the elements at a later stage of the process.
Figure 8:
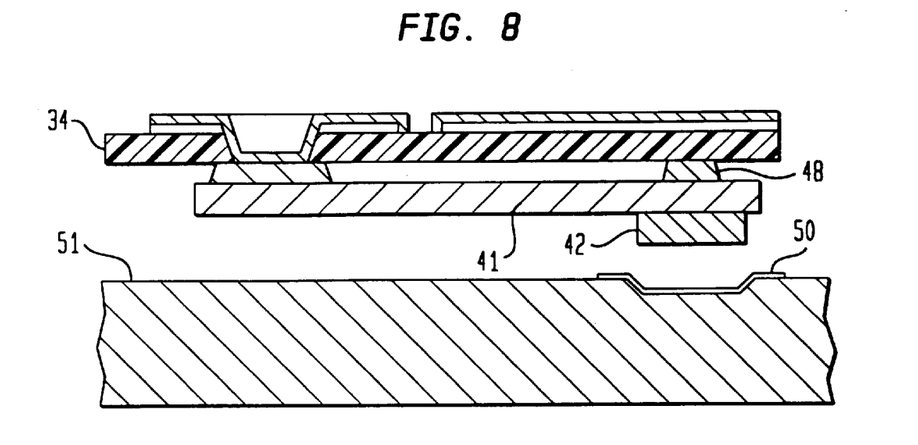
FIGS. 8–10 are diagrammatic sectional views depicting steps in the manufacturing process at successively later stages.
Figure 9:
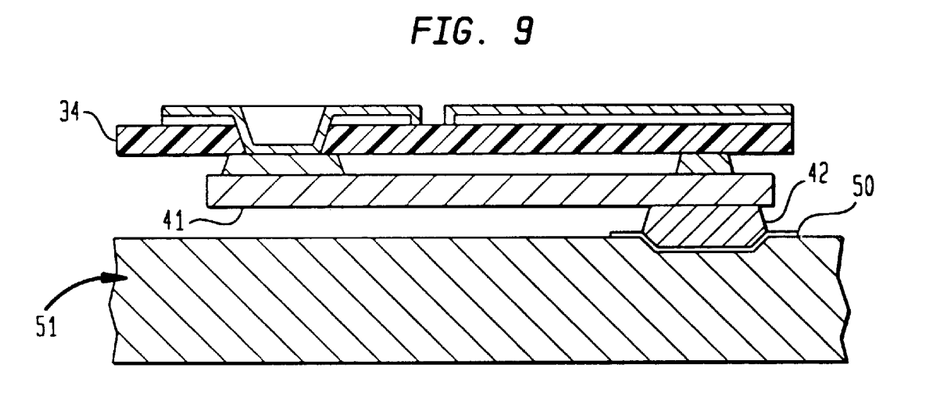

After aligning the sheet-like element 30 with the microelectronic component 51, a disk 61 (FIG. 7) is placed on the sheet-like element 30. The disk is preferably fabricated from ceramic, although other thermally stable materials may be used. The disk 61 has a diameter smaller than the inside diameter of the frame ring 12, but the same or larger than the external diameter of the microelectronic component 51. The weight of disk 61 deflects the sheet-like element 40 downward toward the microelectronic component. The deflection illustrated in FIG. 7 is greatly exaggerated in the drawing for clarity of illustration. In actual practice, the bottom surface of the sheet lies only a few thousands of an inch above the surface of the microelectronic element, and deflects downwardly by only a few thousands of an inch when disk 61 is applied. Additional force is applied to the disk 61 until the sheet-like element 40 contacts the microelectronic component 51. The bond pads 42 in the example shown in FIG. 8 are now in contact with the terminal pads 50 of the microelectronic component 51. The assembly as shown in FIG. 7 is then heated in order to activate the bonding agent present at the interface between the bond pads 42 and the terminal pads 50, metallurgically bonding those components (FIG. 9). During this heating step, the sheet remains taut.

As noted, the bonding technique of the invention is especially suited for smaller component sizes wherein the significance of the variation in height of the bond pads and the terminal pads is reduced. For example, this technique may be used for single-chip wafers or for wafers containing a small array of chips, such as a three by three array. For such application, the technique provides a low-cost, flexible alternative to the hot air press bonding technique.

Figure 10:
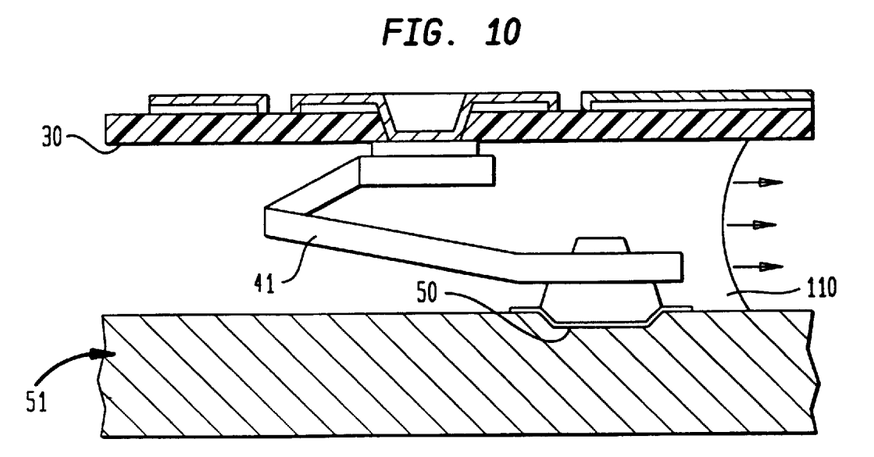
Figure 11:
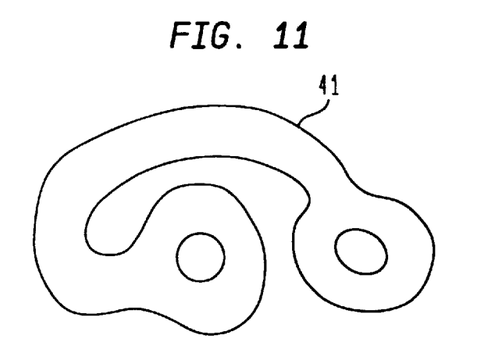
FIG. 11 is a diagrammatic plan view depicting a preferred embodiment of a lead used in the manufacturing process.

After the bond pads 42 are bonded to the terminal pads on the electrical component 51, an encapsulant comprising a compliant dieletric layer 110, such a silicone, is injected between the sheet-like element 30 and the microelectronic element 51. In a preferred embodiment of the invention, force of the pressurized encapsulant 110 acting on the sheet-like element 30 and the microelectronic component 51 separate those two elements as the encapsulant is injected (FIG. 10). The relative motion of those two components separates the leads 41 from the sheet-like element 30, bending them to their final configuration. Such a lead 41 is shown in plan view in FIG. 11.

In an alternative embodiment, the leads 41 are bent and formed before injecting the encapsulant 110. This technique is preferred in the case where straight leads (not shown) are used in place of the curved lead 41 of FIG. 10. Straight leads are used where space is limited by a high terminal pad density of the microelectronic component. In this embodiment, the assembly is placed in a fixture including an upper platen for grasping the sheet-like element 30 and a lower platen for grasping the microelectronic component 51. The platens may use ports for applying vacuum to those components in order to grasp them. The sheet-like element 30 is then displaced away from and parallel to the microelectronic element component 51 in order to bend the lead 41. This process is especially suitable for leads requiring bending in both the horizontal and vertical directions. The space between the sheet-like element 30 and the microelectronic element 51 is then filled with the encapsulant 110 as described above.

In either technique, the encapsulant 110 flows around and between each of the leads 41, providing a resilient backing to apply an even force to the terminals 44 upon assembly to a circuit board or other component.

Various other lead configurations may be used and still practice the invention. In addition to the curved lead shown in plan view in FIG. 10, other geometries such as spiral leads, S-shaped leads, bent leads and leads having multiple traces may be used. Lead formation is additionally described in U.S. Pat. No. 5,518,964, which has been incorporated by reference in this application.

These and other variations and combinations of the features discussed above can be utilized without departing from the present invention as defined by the claims. The foregoing description of the preferred embodiment should be taken as illustrating, rather than limiting, the invention, as claimed.

What is claimed is:

1. A method of mounting a sheet-like microelectronic element, comprising:

bonding the sheet-like element to an expansion ring, wherein said sheet-like element comprises a dielectric layer having a top surface and a bottom surface opposite the top surface;

heating and expanding said expansion ring to stretch the sheet-like element taut;

bonding said sheet-like element to a frame ring having an outside diameter less than an inside diameter of said expansion ring; and forming a plurality of leads on the bottom surface of the sheet-like element, wherein each of the leads has a bonding pad.

2. The method as claimed in claim 1, wherein said expansion ring consists essentially of aluminum.

3. The method as claimed in claim 1, wherein said frame ring consists essentially of molybdenum.

4. The method as claimed in claim 1, further comprising the step of removing said expansion ring by severing the sheet-like element between said expansion ring and said frame ring.

5. The method of claim 1, further comprising the step of forming a plurality of terminals on the top surface of the sheet-like element, wherein each of the terminals is electrically interconnected to one of the leads.

6. The method of claim 1, wherein, prior to the lead forming step, said sheet-like element further comprises a first copper layer disposed on the top surface of the sheet-like element and said lead forming step comprises forming a plurality of leads from the first copper layer.

7. The method of claim 6, wherein said sheet-like element further comprises a second copper layer disposed on the bottom surface of the sheet-like element.

8. The method of claim 7, further comprising the step of forming a plurality of terminals from the second copper layer, wherein each of the terminals is electrically interconnected to one of the leads.

9. A method of bonding a plurality of bond pads disposed on a flexible, sheet-like microelectronic element to a plurality of contacts on a microelectronic component, comprising:

mounting the flexible, sheet-like element on a frame ring;

placing the microelectronic component on a rigid plate;

placing said frame ring on said rigid plate so that the sheet-like element overlies and is spaced away from the microelectronic component;

aligning the plurality of bond pads with the plurality of contacts by moving the frame ring and the component in relation to one another, wherein the plurality of bond pads are on tip ends of deformable leads;

placing a disk on said sheet-like element, said disk having a diameter smaller than an inside diameter of said frame ring;

applying downward pressure on said disk, whereby the plurality of bond pads are pressed against the plurality of contacts;

heating the plurality of bond pads and the plurality of contacts whereby a bonding agent at an interface therebetween is actuated;

providing a fixture having a first platen and a second platen;

grasping at least one of the sheet-like element and the frame ring with said first platen;

grasping the microelectronic component with said second platen; and deforming the deformable leads by moving the first platen and the second platen in relation to one another.

10. The method of claim 9, wherein, before the deforming step, the deformable lead is straight.

11. The method of claim 9, wherein the step of grasping at least one of the sheet-like element and the frame ring comprises the step of grasping the sheet-like element.

12. The method of claim 11, further comprising severing the sheet-like element from the frame ring prior to grasping the sheet-like element.

13. The method of claim 9, further comprising disposing an encapsulant between the sheet-like element and the microelectronic component.

14. The method of claim 13, wherein the encapsulant is a silicone.

15. The method of claim 9, wherein the first platen and the second platen have vacuum ports.

16. The method of claim 15, wherein the step of grasping the sheet-like element with the first platen includes the step of applying a vacuum.

17. The method of claim 16, wherein the step of grasping the microelectronic component with the second platen includes the step of applying a vacuum.

18. The method of claim 9, wherein the microelectronic component is a semiconductor chip.

19. A method of bonding a plurality of bond pads disposed on a flexible, sheet-like microelectronic element to a plurality of contacts on a microelectronic component, comprising:

bonding the sheet-like element to an expansion ring;

heating and expanding said expansion ring to stretch the sheet-like element taut;

bonding said sheet-like element to a frame ring, said frame ring having an outside diameter less that an inside diameter of said expansion ring;

placing the microelectronic component on a rigid plate;

placing said frame ring on said rigid plate so that the sheet-like element overlies the microelectronic component;

aligning the plurality of bond pads with the plurality of contacts by moving the frame ring and the microelectronic component in relation to one another;

placing a disk on said sheet-like element, said disk having a diameter smaller than an inside diameter of said frame ring;

applying downward pressure on said disk, whereby the plurality of bond pads are pressed against the plurality of contacts;

heating the plurality of bond pads and the plurality of contacts whereby a bonding agent at an interface therebetween is actuated;

providing a fixture having a first platen and a second platen;

grasping at least one of the sheet-like element and the frame ring with said first platen;

grasping the microelectronic component with said second platen; and deforming the deformable leads by moving the first platen and the second platen in relation to one another.

20. The method as claimed in claim 19, wherein the rigid plate and the frame ring consist essentially of molybdenum and the expansion ring consists essentially of aluminum.

21. The method of claim 19, wherein the deformable lead is straight before the deforming step.

22. The method of claim 19, wherein the step of grasping at least one of the sheet-like element and the frame ring comprises the step of grasping the sheet-like element.

23. The method of claim 22, further comprising severing the sheet-like element from the frame ring prior to grasping the sheet-like element.

24. The method of claim 19, further comprising disposing an encapsulant between the sheet-like element and the microelectronic component.

25. The method of claim 24, wherein the encapsulant is a silicone.

26. The method of claim 19, wherein the first platen and the second platen have vacuum ports.

27. The method of claim 26, wherein the step of grasping at least one of the sheet-like element and the frame ring with the first platen includes the step of applying a vacuum.

28. The method of claim 27, wherein the step of grasping the microelectronic component with the second platen includes the step of applying a vacuum.

29. The method of claim 19, wherein the microelectronic component is a semiconductor chip.

* * * * *